United States Patent
Kim et al.

(10) Patent No.: US 8,006,639 B2
(45) Date of Patent: Aug. 30, 2011

(54) CATALYTIC ENHANCED CHEMICAL VAPOR DEPOSITION APPARATUS HAVING EFFICIENT FILAMENT ARRANGEMENT STRUCTURE

(75) Inventors: Han-Ki Kim, Suwon-si (KR); Myung-Soo Huh, Suwon-si (KR); Myoung-Soo Kim, Suwon-si (KR); Kyu-Sung Lee, Suwon-si (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 1446 days.

(21) Appl. No.: 11/439,350

(22) Filed: May 24, 2006

(65) Prior Publication Data

US 2006/0269671 A1 Nov. 30, 2006

(30) Foreign Application Priority Data

May 24, 2005 (KR) .................. 10-2005-0043827

(51) Int. Cl.
*C23C 16/00* (2006.01)
(52) U.S. Cl. .................. 118/723 HC; 118/715
(58) Field of Classification Search ............ 118/723 HC, 118/715
See application file for complete search history.

(56) References Cited

U.S. PATENT DOCUMENTS

| | | | | |
|---|---|---|---|---|
| 4,440,108 A | * | 4/1984 | Little et al. | 118/719 |
| 5,833,753 A | * | 11/1998 | Herlinger et al. | 118/724 |
| 5,879,450 A | * | 3/1999 | Lee et al. | 117/88 |
| 6,045,877 A | * | 4/2000 | Gleason et al. | 427/522 |
| 6,153,269 A | * | 11/2000 | Gleason et al. | 427/490 |
| 6,349,669 B1 | * | 2/2002 | Matsumura et al. | 118/723 HC |
| 6,427,622 B2 | * | 8/2002 | Madan et al. | 118/723 HC |
| 6,582,780 B1 | | 6/2003 | Tolt | |
| 7,211,152 B2 | * | 5/2007 | Ishibashi et al. | 118/724 |
| 2004/0065260 A1 | * | 4/2004 | Ishibashi et al. | 118/724 |
| 2004/0149211 A1 | * | 8/2004 | Ahn et al. | 118/715 |
| 2006/0269671 A1 | * | 11/2006 | Kim et al. | 427/255.14 |

FOREIGN PATENT DOCUMENTS

| | | |
|---|---|---|
| JP | 2000-223421 | 8/2000 |
| JP | 2003-41365 | 2/2003 |
| JP | 2004-190132 | 7/2004 |
| KR | 1993-19805 | 9/1993 |

OTHER PUBLICATIONS

Transmittal letter and Japanese Office action issued on Jun. 16, 2009 in Applicant's corresponding Japanese Patent Application No. 2006-139881.
Korean Office Action for Korean Patent Application No. 2005-0043827 issued on Sep. 15, 2006.

\* cited by examiner

*Primary Examiner* — Jeffrie R Lund
(74) *Attorney, Agent, or Firm* — Robert E. Bushnell, Esq.

(57) ABSTRACT

The present invention provides a catalytic enhanced chemical vapor deposition (CVD) apparatus capable of maximizing efficiency of gas use to 80% or more, and obtaining a uniform thin film by efficiently arranging filaments mounted on a shower head of the catalytic enhanced CVD apparatus, thereby uniformly decomposing a deposition source gas. The present invention also provides a method for fabricating an organic electroluminescent device with an inorganic film formed through the catalytic enhanced CVD apparatus.

19 Claims, 7 Drawing Sheets

CATALYTIC ENHANCED CHEMICAL VAPOR DEPOSITION APPARATUS HAVING EFFICIENT FILAMENT ARRANGEMENT STRUCTURE

CLAIM OF PRIORITY

This application makes reference to, incorporates the same herein, and claims all benefits accruing under 35 U.S.C.§119 from an application for CATALYTIC ENHANCED CHEMICAL VAPOR DEPOSITION APPARATUS HAVING EFFECTIVE FILAMENT OF ARRANGEMENT STRUCTURE, earlier filed in the Korean Intellectual Property Office on the 24$^{th}$ of May 2005 and there duly assigned Serial No. 10-2005-0043827.

BACK GROUND OF THE INVENTION

1. Field of the Invention

The present invention relates to a catalytic enhanced chemical vapor deposition (CVD) apparatus and a method for fabricating an organic electroluminescent device using an inorganic film formed through the catalytic enhanced CVD apparatus. The catalytic enhanced CVD apparatus is capable of maximizing efficiency of gas use to 80% or more, and accordingly capable of obtaining a uniform thin film by efficiently arranging filaments mounted on a shower head of the catalytic enhanced CVD apparatus, thereby uniformly decomposing a deposition source gas.

2. Description of the Related Art

A thin film for encapsulation of an organic electroluminescent device is formed on an upper part of an organic electroluminescent (EL) device using silicon nitride (SiNx) or silicon oxynitride (SiON) by a plasma process such as Inductive Coupled Plasma Chemical Vapor Deposition (IPCVD) process, Plasma-Enhanced Chemical Vapor Deposition (PECVD) process, etc.

CVD equipment includes a deposition source gas supply unit for carrying a deposition source gas, and a shower head for uniformly ejecting a deposition source gas received from the deposition source gas supply unit into a reaction chamber in which a substrate is mounted. The shower head includes a shower zone for receiving the deposition source gas supplied from the deposition source gas supply unit, and deposition source gas injection nozzles for injecting the received deposition source gas into the reaction chamber. A metallic thin film or inorganic film is formed by the CVD equipment.

A hydrogenated silicon nitride (SiN:H) thin film is formed by using silane ($SiH_4$)/ammonia ($NH_3$)/nitrogen ($N_2$) deposition source gases, and a silicon oxynitride (SiON) thin film is formed by using silane ($SiH_4$)/ammonia ($NH_3$)/nitrous oxide ($N_2O$) deposition source gases. Because it is difficult to completely decompose hydrogen bond of the deposition source gas such as ammonia ($NH_3$), a large amount of hydrogen is contained in silicon nitride (SiNx) or silicon oxynitride (SiON) and characteristics of the thin film deteriorates. Particularly, content of hydrogen in a thin film for encapsulation should be minimized, because if a large amount of hydrogen exists during encapsulation for an organic electroluminescent device, characteristics of the organic electroluminescent device are affected through reaction of hydrogen with oxygen.

A method for depositing a thin film of large area on a substrate by forming a filament with a narrower width and longer length thereby moving the filament part side to side to decompose reaction gas SiH4 in a conventional CVD apparatus is disclosed in Korean Utility Model Laid-open Publication No. 1993-0019805. An apparatus including filaments having equal lengths formed on two parallel electrodes with the filaments being spaced from one another in a certain distance in a HF(Hot Filament)-CVD apparatus are disclosed in U.S. Pat. No. 6,582,780. An efficient arrangement structure between the filaments and the gas nozzles is, however, not considered in the CVD apparatus described above, and a structure in which filaments and gas nozzles are mounted on a shower head is not found. Therefore, the conventional CVD apparatus has a problem that use efficiency of a deposition source gas used in formation of a thin film is lowered to within 5%, because hydrogen bond is separated in case of a conventional PECVD.

SUMMARY OF THE INVENTION

Therefore, in order to solve the foregoing problem, it is an object of the present invention to provide a catalytic enhanced CVD apparatus capable of obtaining a uniform thin film by efficiently arranging filaments on a shower head of the catalytic enhanced CVD apparatus, which uniformly decomposes a deposition source gas, thereby maximizing the efficiency of gas use, and a fabrication method of an organic electroluminescent device that adopts a thin film formed by the catalytic enhanced CVD apparatus having the filament arrangement structure.

In order to achieve the foregoing object of the present invention, the present invention provides a catalytic enhanced CVD apparatus including a deposition chamber, a shower head for storing a deposition source gas, the showerhead including at least two electrodes, a plurality of gas nozzles formed on the shower head and coupled to the deposition chamber for spraying the deposition source gas into inside of the deposition chamber, and a filament formed on the shower head and disposed below the plurality of gas nozzles. The filaments are constructed in such a structure that they are symmetrical side to side about an axis passing through a center of the shower head.

Furthermore, the present invention provides a catalytic enhanced CVD apparatus including a deposition chamber, a shower head for storing a deposition source gas, the showerhead including at least two electrodes, a plurality of gas nozzles formed on the shower head and coupled to the deposition chamber for spraying the deposition source gas into inside of the deposition chamber, and a filament formed on the shower head and disposed below the plurality of gas nozzles. The filaments mounted on the shower head are constructed in a manner that the filaments are diagonally symmetric about the center of the shower head.

Furthermore, the present invention provides a catalytic enhanced CVD apparatus including a deposition chamber, a shower head for storing a deposition source gas, the showerhead including at least two electrodes, a plurality of gas nozzles formed on the shower head and coupled to the deposition chamber for spraying the deposition source gas into inside of the deposition chamber, and a filament formed on the shower head and disposed below the plurality of gas nozzles. The structure of the filaments is obtained by repeating two or more equal structures of the filaments.

Furthermore, the present invention provides a fabrication method of an organic electroluminescent device including providing a substrate, forming a first electrode on an upper part of the substrate, forming an organic film on an upper part of the first electrode, the organic film including an organic light-emitting layer, forming a second electrode on an upper part of the organic film; and forming an inorganic film on an upper part of the second electrode, the inorganic film being formed by a catalytic enhanced chemical vapor deposition apparatus having a filament being formed into a filament pattern, the filament pattern being selected from the group consisting of a pattern having mirror symmetry, a pattern having point symmetry, and a pattern being asymmetric The filaments are formed of tungsten (W), tantalum (Ta), nickel (Ni), or chromium (Cr), and the filaments are preferably formed of tungsten (W).

The filaments decompose silane ($SiH_4$)/ammonia ($NH_3$)/nitrogen ($N_2$) deposition source gases in a filament region to form a hydrogenated silicon nitride (SiN:H) thin film, and decompose silane ($SiH_4$)/ammonia ($NH_3$)/nitrous oxide ($N_2O$) deposition source gases in the filament region to form a silicon oxynitride (SiON) thin film.

The inorganic film is silicon nitride ($SiN_x$) or silicon oxynitride (SiON).

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
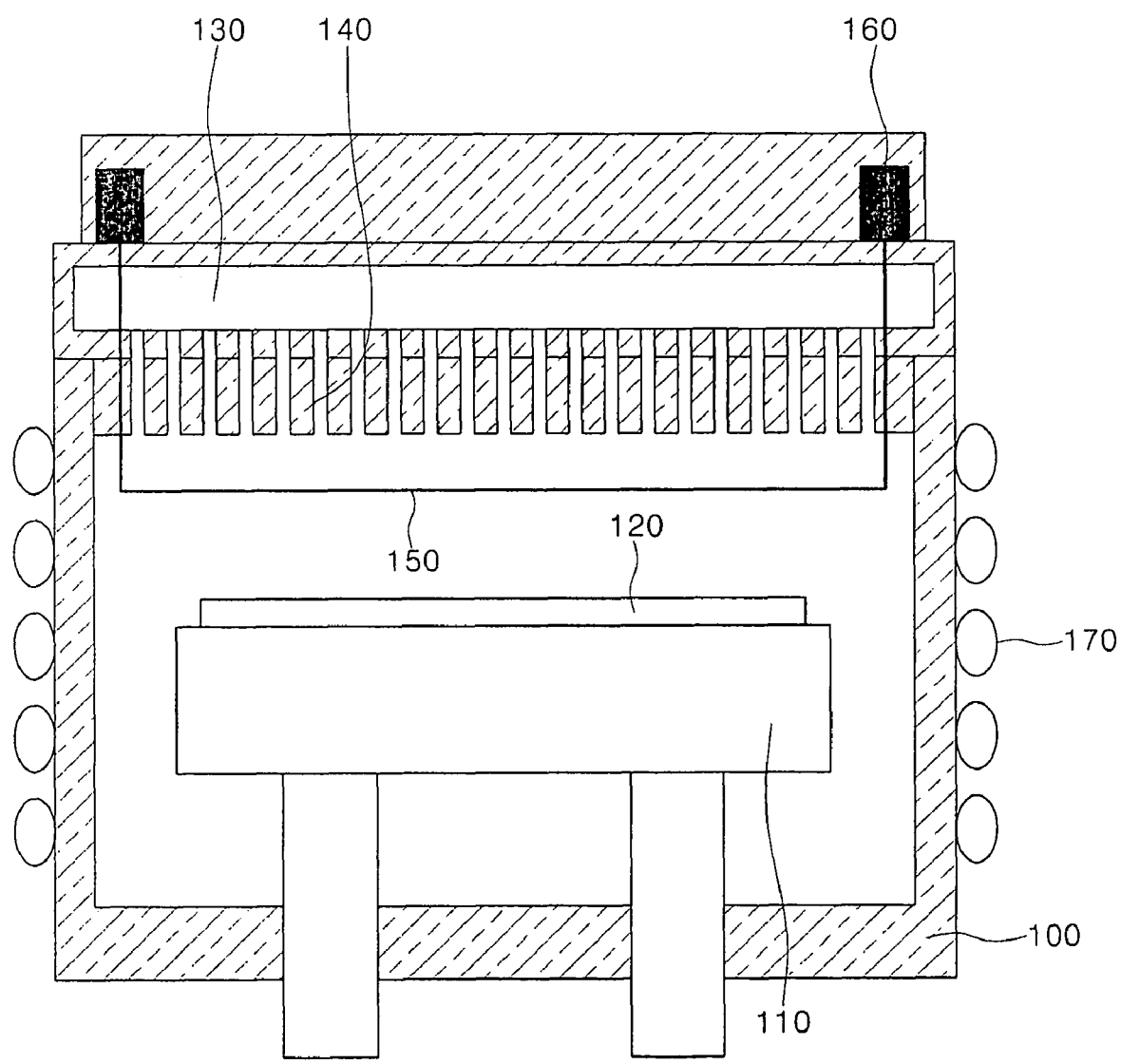
FIG. 1 is a cross-sectional view schematically illustrating a structure of a catalytic enhanced CVD apparatus of the present invention.

The present invention will now be described in detail in connection with preferred embodiments with reference to the accompanying drawings. For reference, like reference characters designate corresponding parts throughout several views.

FIG. 1 is a cross-sectional view schematically illustrating basic structure of a catalytic enhanced CVD (hereinafter referred to as "CECVD") apparatus of the present invention. The CECVD is described as follows referring to FIG. 1.

Power from an external power supply unit is supplied to electrode 160 that connects to filament 150 located inside chamber 100. Gases including silane (SiH4), ammonia (NH3) and nitrogen (N2) are injected into shower head 130 through a gas injection port (not shown) under a vacuum state. The gases injected into shower head 130 are sprayed through gas nozzles 140. When the sprayed gases pass through filament 150 that is heated to a temperature of about 1,800° C., the sprayed gases are pyrolyzed by heat produced from filament 150, and as a result a thin film is formed on substrate 120 that is supported by substrate holder 110. This process is called catalytic enhanced CVD (CECVD), because reaction for the film formation is accelerated by filament 150.

Pyrolytic characteristics of the catalytic enhanced CVD depend on properties of filament 150. Characteristics of a silicon nitride ($SiN_x$) thin film can be improved by using a catalytic enhanced CVD having the arrangement and structure of the filaments disclosed in the present invention, because the deposition source gas is decomposed in a filament region. In this process, hydrogen bonds of the source gas are completely decomposed. The catalytic enhanced CVD is capable of minimizing concentration of hydrogen in a silicon nitride ($SiN_x$) thin film, because silicon (Si) or nitrogen (N) radical, which is produced when hydrogen bonding is completely decomposed, takes part in the growth of the thin film.

Filament 150 is made of a metal selected from tungsten (W), tantalum (Ta), nickel (Ni), or chromium (Cr). Tungsten (W) is preferred, because tungsten (W) has a high melting temperature. Filament 150 is connected to electrodes 160, and is heated to a high temperature when power is supplied to electrode 160 from an external power supply unit.

Different types of thin films are formed when different deposition source gases are used. A oxynitride (SiON) thin film is formed when silane (SiH4), ammonia (NH3) and nitrous oxide ($N_2O$) are used as the deposition source gases.

Furthermore, wall heater 170 may be additionally mounted on the outer wall of chamber 100. Wall heater 170 is installed to heat the deposition material to a certain temperature, which prevents particle formation and improves deposition efficiency. If the temperature of the wall of chamber 100 is not high enough, the deposition material that should be deposited on substrate 120 is also deposited on the inner wall of chamber 100, which results in waste of the deposition material, reduction of deposition efficiency, and formation of particles.

The density distribution of gases sprayed from shower head 130 depends on sizes and positions of gas nozzles 140 and filament 150. In order to maintain uniform density of gases sprayed from shower head 130, the sizes and positions of gas nozzles 140 and filament 150 are properly selected, and the position and shape of shower head 130 is designed according to the optimized sizes and positions of gas nozzles 140 and filament 150.

Figure 16A:
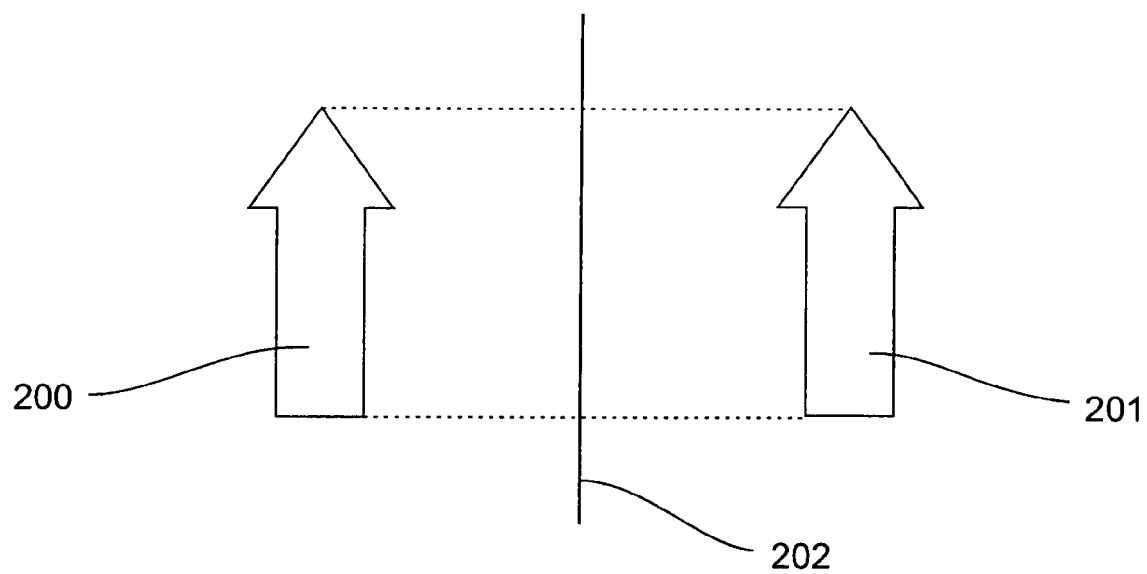
FIG. 16(a) illustrates mirror symmetry of a filament pattern.
Figure 16B:
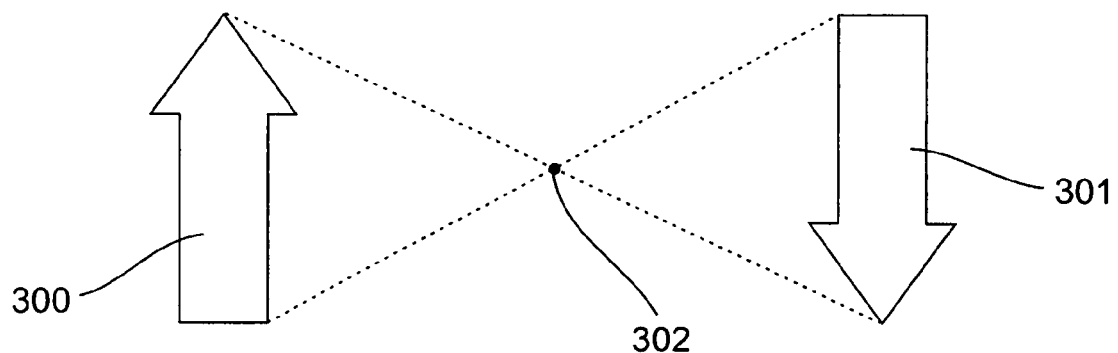
FIG. 16(b) illustrates point symmetry of a filament pattern.

In the preferred embodiments of the present invention, a uniform coating of a thin film is obtained by controlling the position of filament 150 rather than the position of gas nozzles 140. Filament 150 provided in the present invention is formed into a pattern. Various patterns are suggested in the present invention as examples. Symmetrical properties of the pattern are described in FIGS. 16(a) and 16(b). Arrows, 200, 201, 300, and 301 shown in FIGS. 16(a) and 16(b) represent patterns. Referring to FIG. 16(a), first arrow 200 and second arrow 201 are identical, and symmetric about line of symmetry 202. Herein, in the description of the present invention, if there exists a line of symmetry in a pattern, it is defined that the pattern has mirror symmetry. Referring to FIG. 16(b), third arrow 300 and fourth arrow 301 are the inverted mirror images to each other. In the other words, third arrow 300 and fourth arrow 301 are symmetric about point of symmetry 302. Herein, in the description of the present invention, if there exists a point of symmetry in a pattern, it is defined that the pattern has point symmetry. If a pattern has neither mirror symmetry nor point symmetry, it is defined that the pattern is asymmetric.

Preferred embodiments of the present invention are described in detail as follows referring to drawings of the present invention.

FIRST PREFERRED EMBODIMENT

Figure 2:
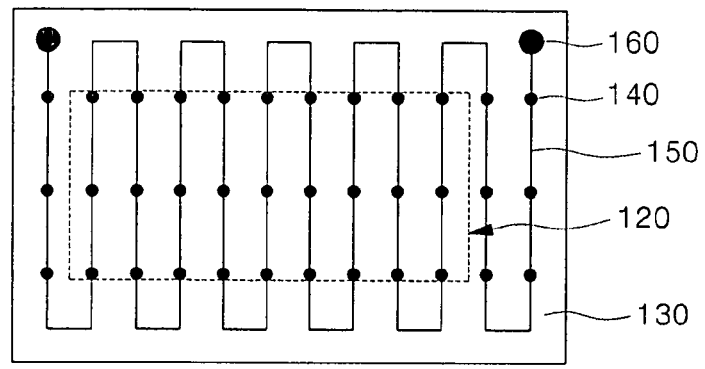
FIG. 2 is a plan drawing illustrating positions of a shower head, nozzles, filaments and a substrate on a plane in a catalytic enhanced CVD apparatus of FIG. 1 built as a first preferred embodiment of the present invention.

FIG. 2 is a plan drawing projected on a plane from the top of the catalytic enhanced CVD apparatus shown in FIG. 1. FIG. 2 illustrates positions of shower head 130, nozzles 140, filament 150, and substrate 120 disposed in a catalytic enhanced CVD apparatus of FIG. 1 constructed as a first preferred embodiment of the present invention.

Referring to FIG. 2, filament 150 is formed into a pattern. In this embodiment, the pattern has a square waveform shape, and has mirror symmetry. The pattern of filament 150 is symmetrical side to side about the center of shower head 130. Electrodes 160 for supplying power from an external power source to filaments 150 is formed at the left and right corners of the upper part of shower head 130, and accordingly filament 150 is connected by a single line as a whole. Substrate 120 is smaller than the shower head 130 and is disposed such that no difference in uniformity is made between a film deposited on an edge part of substrate 120 and a film deposited on a central part of the substrate.

Filament 150 may be formed of tungsten (W), tantalum (Ta), nickel (Ni), or chromium (Cr). Filament 150 is preferably formed of tungsten (W). Filament 150 has a thickness of 0.3 mm or more. If the thickness of Filament 150 is 0.3 mm or more, deposition characteristics of deposition source gases are improved. Preferably, the thickness of filament 150 is between 0.3 mm and 2.0 mm. If the thickness of filament 150 is less than 0.3 mm, decomposition of the deposition source gases can deteriorate, and if the thickness of filament 150 is greater than 2.0 mm, higher temperature is required for the deposition process.

Filament 150 built according to the first preferred embodiment of the present invention are a series type filament arrangement, which makes power control and fabrication of the filaments simple. In the filament arrangement as described above, deposition source gases is uniformly decomposed in the entire thin film formation region of substrate 120, and the efficiency of the deposition source gases is improved to a level higher than 80%. A uniform thin film is obtained, with high quality and improved characteristics of the thin film. It is found that the arrangement structure of the filament is the most important factor that affects the characteristics of the catalytic enhanced CVD apparatus.

FIG. 3 to FIG. 10 are plan drawings projected on a plane from the top of the catalytic enhanced CVD apparatus shown in FIG. 1. FIG. 3 to FIG. 10 illustrate positions of shower head 130, nozzles 140, filament 150, and substrate 120 disposed in a catalytic enhanced CVD apparatus of FIG. 1 constructed as a second to a ninth preferred embodiments of the present invention.

In the second to ninth preferred embodiments of the present invention, filaments 150 mounted on shower head 130 of a catalytic enhanced CVD apparatus are formed into patterns that have mirror symmetry. The filament patterns are symmetrical side to side about a vertical line passing though the center of shower head 130. The detail arrangements of filament 150 and electrodes 160 in the second to ninth preferred embodiments of the present invention are, however, different from that of the first preferred embodiment of the present invention.

SECOND PREFERRED EMBODIMENT

Figure 3:
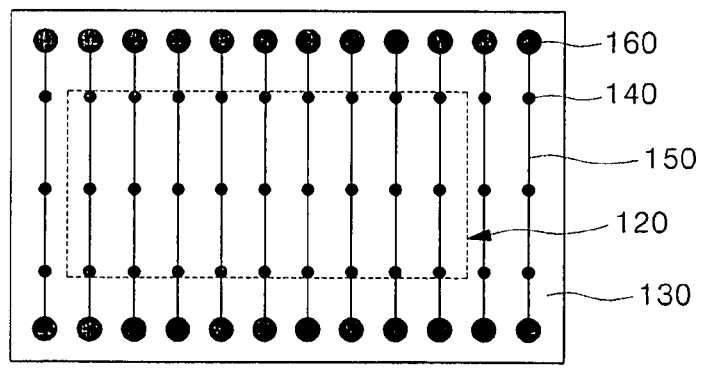
FIG. 3 to FIG. 10 are plan drawings illustrating positions of a shower head, nozzles, filaments and a substrate on a plane in a catalytic enhanced CVD apparatus built as a second to ninth preferred embodiments of the present invention.

Referring to FIG. 3, the second preferred embodiment of the present invention includes a regular parallel type filaments spaced apart from one another in an equal distance. An arrangement structure of filaments built according to the second preferred embodiment includes multiple filaments 150, each of which is not connected to one another, but are separated from one another, and stretched longitudinally such that multiple electrodes 160 are respectively connected to filaments 150. Multiple gas nozzles 140 are disposed between a pair of electrodes 160.

Filaments 150 according to the second preferred embodiment of the present invention are arranged in parallel, therefore the filaments are capable of being fabricated more simply, and uniformity of a thin film is easily controlled by controlling a distance between the filaments.

THIRD PREFERRED EMBODIMENT

Figure 4:
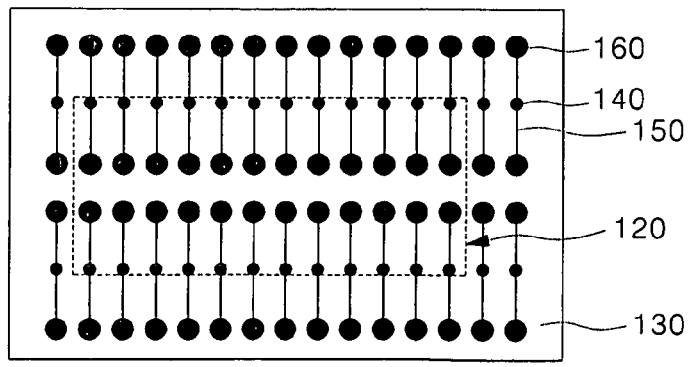

The third preferred embodiment of the present invention referring to FIG. 4 includes two sets of parallel type filaments that are identical in size and shape, and arranged parallel to each other. An arrangement structure of the filaments built according to the third preferred embodiment includes pairs of multiple electrodes 160 which are periodically disposed parallel to vertical and horizontal edges of shower head 130, multiple gas nozzle 140 formed in a row between a pair of electrodes 160 with being spaced apart from each other in a certain distance, and multiple filaments 150 formed between the pairs of electrodes 160.

More in detail, the arrangement structure of filaments 150 according to the third preferred embodiment of the present invention is a filament arrangement structure in which two sets of parallel type filament structure, each of which has a similar filament structure as described in the second embodiment, are arranged parallel to each other. Uniformity of a thin film is easily controlled regardless of a shape of a substrate, and the filaments are easily replaced.

FOURTH PREFERRED EMBODIMENT

Figure 5:
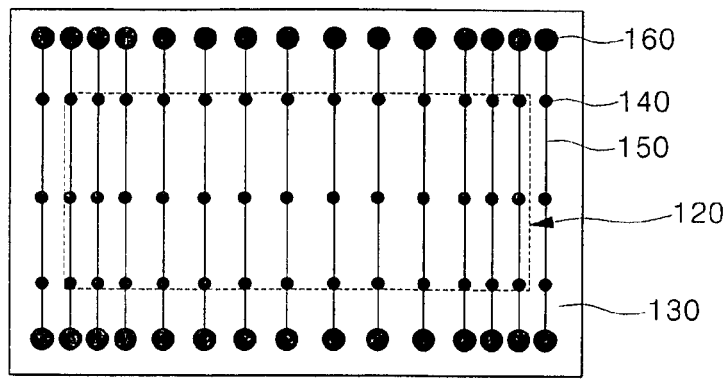

Referring to FIG. 5, fourth preferred embodiment of the present invention includes parallel type filaments in which the filaments are arranged such that distances between filaments gradually changes. Specifically, distances between filaments 150 on edge parts are shorter than the distances of filaments 150 on the central part. The filament arrangement structure built according to the fourth preferred embodiment includes multiple electrodes 160 formed in a row such that the electrodes are parallel to both edges of shower head 130, and distances between filaments 150 disposed at the left and right sides of shower head 130 are shorter than distances between filaments 150 disposed around center of shower head 130, multiple gas nozzles 140 formed in a row between the electrodes 160 with being spaced from one another in a certain distance, and multiple separated filaments 150 formed to connect a pair of electrodes 160.

A filament arrangement structure according to the fourth preferred embodiment of the present invention is a filament arrangement structure in which filaments on the edge parts are more densely arranged to adjust uniformity of the thin film, because it is generally difficult to adjust uniformity of a thin film on edge parts of shower head 130.

FIFTH PREFERRED EMBODIMENT

Figure 6:
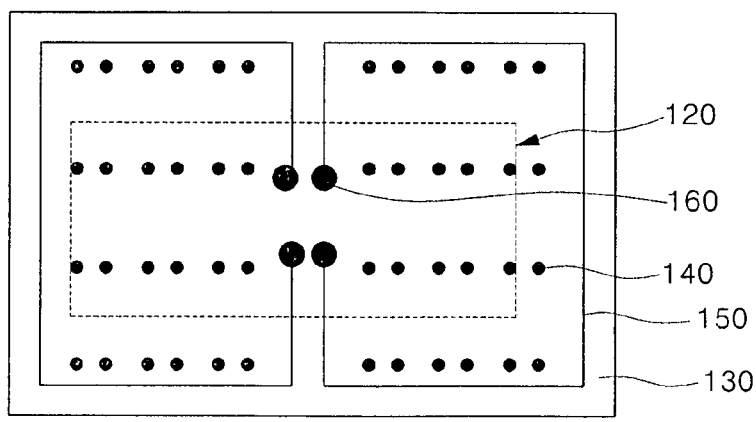

Referring to FIG. 6, the fifth preferred embodiment of the present invention defines a filament arrangement structure in which filaments 150 surround gas nozzles 140, and gas nozzles 140 are regularly formed in a loop of filament 150. A filament arrangement structure built according to the fifth preferred embodiment includes multiple pairs of electrodes 160 which are formed around the center of shower head 130 in a shape of two dimensional array, gas nozzles 140 formed in a row on an outer part of the electrodes such that the gas nozzles are spaced apart from one another in a certain distance, and filaments 150 which encircle the gas nozzles 140 and connect electrodes 160, where the electrodes, the gas nozzles, and the filaments are formed symmetrically about a vertical line passing through a center of shower head 130. The filament arrangement structure according to the fifth preferred embodiment of the present invention is a filament arrangement structure for improving uniformity of a thin film.

SIXTH PREFERRED EMBODIMENT

Figure 7:
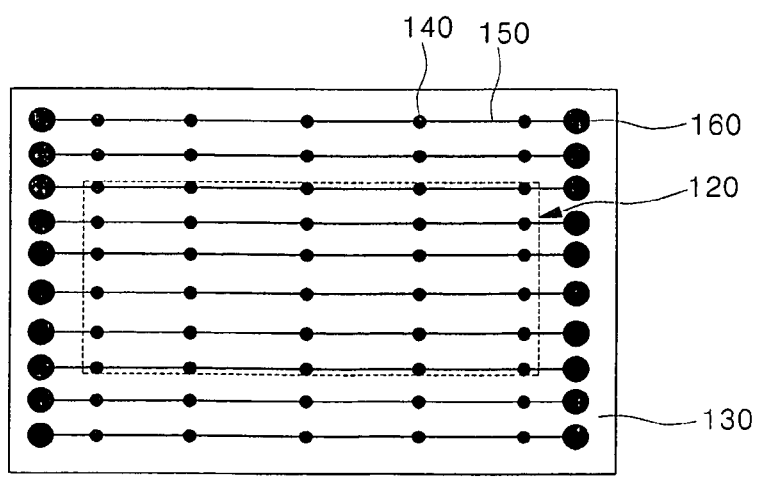

Referring to FIG. 7, the sixth preferred embodiment of the present invention defines a series type arrangement structure of filaments having the same size and distance between the filaments. A filament arrangement structure built according to the sixth preferred embodiment includes multiple pairs of electrodes 160 which are parallel to both edges of shower head 130 and are formed in a row such that the electrodes are spaced from one another in a certain distance, multiple gas nozzles 140 formed in a row between the electrodes 160 such that the gas nozzles are spaced from one another in a certain distance, and multiple separated filaments 150 formed under the gas nozzles to connect the pairs of electrodes 160. Although a filament arrangement structure according to the sixth preferred embodiment of the present invention is similar to the filament arrangement structure according to the first preferred embodiment of the present invention, the filament arrangement structure according to the sixth preferred embodiment of the present invention is a filament arrangement structure in which the filaments 150 are formed in series to improve uniformity of a thin film.

SEVENTH PREFERRED EMBODIMENT

Figure 8:
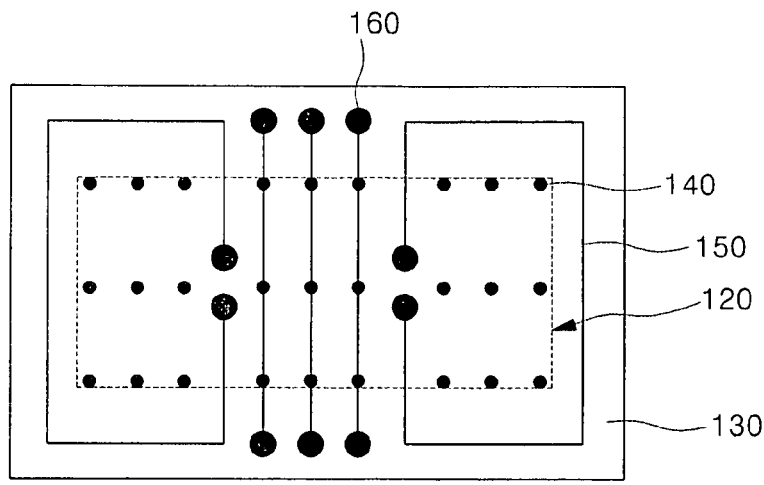

Referring to FIG. 8, the seventh preferred embodiment of the present invention defines a filament arrangement structure in which parallel filaments are formed in a central area of shower head 130, and two sets of loop type filaments 150 that surround gas nozzles 140 are symmetrical formed at the left and right sides of shower head 130.

A filament arrangement structure built according to the seventh preferred embodiment includes multiple pairs of electrodes 160 which are formed on a central part of shower head 130 such that pairs of electrodes are parallel to each other with being spaced from one another in a certain distance, multiple gas nozzles 140 formed between the electrodes such that the gas nozzles are spaced from one another in a certain distance, and multiple separated filaments 150 formed to connect electrodes 160. This filament arrangement is a combination of parallel type arrangement described in the second embodiment and a loop type arrangement described in the fifth embodiment, where parallel type arrangement is disposed in a central area of shower head 130 between two sets of loop type filament arrangement.

Although a filament arrangement structure of the seventh preferred embodiment of the present invention is similar to the filament arrangement structure of the fifth preferred embodiment of the present invention, the filament arrangement structure of the seventh preferred embodiment of the present invention is a filament arrangement structure further including parallel type filaments formed on a central part of a shower head to improve uniformity of a thin film.

EIGHTH PREFERRED EMBODIMENT

Figure 9:
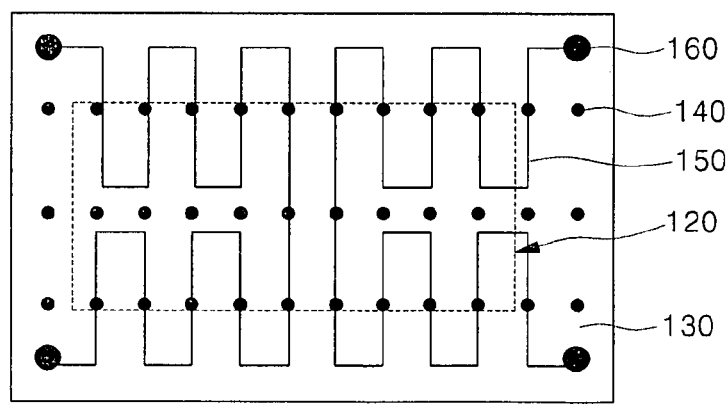

Referring to FIG. 9, the eighth preferred embodiment of the present invention defines a filament arrangement structure in which two sets of irregular patterns of the filaments are symmetrically formed on the left and right parts of shower head 130. The filament arrangement structure built according to the eighth preferred embodiment includes electrodes 160, each of which is formed at each corner of shower head 130, multiple gas nozzles 140 formed in a row in an inner part of the electrodes such that the gas nozzles are spaced from one another in a certain distance, and filaments 150 which connect the electrodes in the upper and lower parts of the shower head and are formed in an irregular shape according to the gas nozzles. The filament arrangement structure according to the eight preferred embodiment of the present invention is a filament arrangement structure for improving uniformity of a thin film.

NINTH PREFERRED EMBODIMENT

Figure 10:
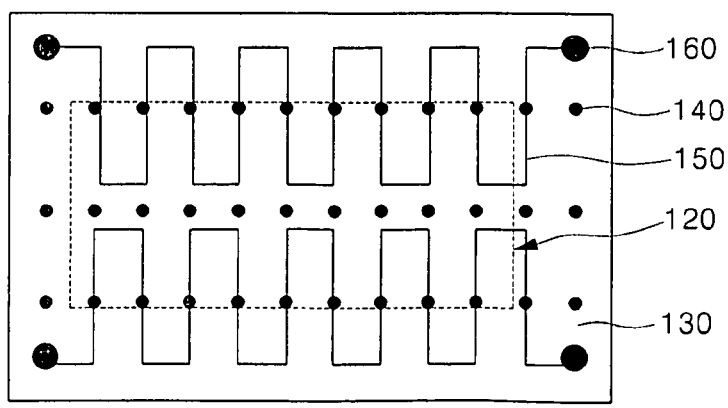

Referring to FIG. 10, the ninth preferred embodiment of the present invention defines a filament arrangement structure in which irregular patterns of the filaments are repeated in upper and lower parts of the shower head. The filament arrangement structure built according to the ninth preferred embodiment includes electrodes 160, each of which is formed on each corner of shower head 130, multiple gas nozzles 140 formed in a row on an inner part of the electrodes such that the gas nozzles are spaced from one another in a certain distance, and filaments 150 which connect the electrodes on the upper part of the shower head and are formed in an irregular shape along the gas nozzles 140. The filament arrangement structure built according to the ninth preferred embodiment of the present invention is a filament arrangement structure for improving uniformity of a thin film.

Filaments 150 arranged according to the first through ninth preferred embodiments are arranged in such a structure that the left and right sides of filament arrangement is symmetric about an axis passing through the center of shower head 130. In the other words, the filament pattern has mirror symmetry, and the line of symmetry is a vertical axis passing through the center of the pattern.

The filaments 150 are made of tungsten (W), tantalum (Ta), nickel (Ni), or chromium (Cr), and preferably made of tungsten (W). Filaments 150 are formed to a thickness of 0.3 mm or more, as suggested in the first preferred embodiment, and the thickness of filaments 150 is preferably between 0.3 mm and 2.0 mm.

The filaments decompose deposition source gases having silane ($SiH_4$)/ammonia ($NH_3$)/nitrogen ($N_2$) in a filament region in case of forming a hydrogenated silicon nitride (SiN:H) thin film, and decompose deposition source gases containing silane ($SiH_4$)/ammonia ($NH_3$)/nitrous oxide ($N_2O$) in case of forming a silicon oxynitride (SiON) thin film.

Figure 11:
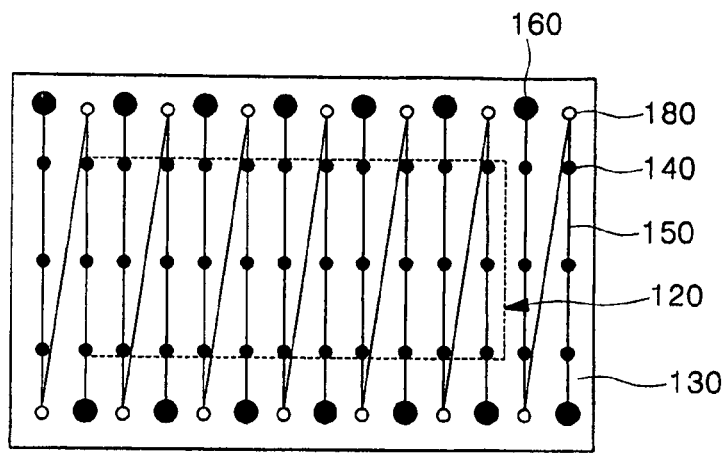
FIG. 11 and FIG. 12 are plan drawings illustrating positions of a shower head, nozzles, filaments and a substrate on a plane in a catalytic enhanced CVD apparatus built as a tenth and an eleventh preferred embodiments of the present invention.
Figure 12:
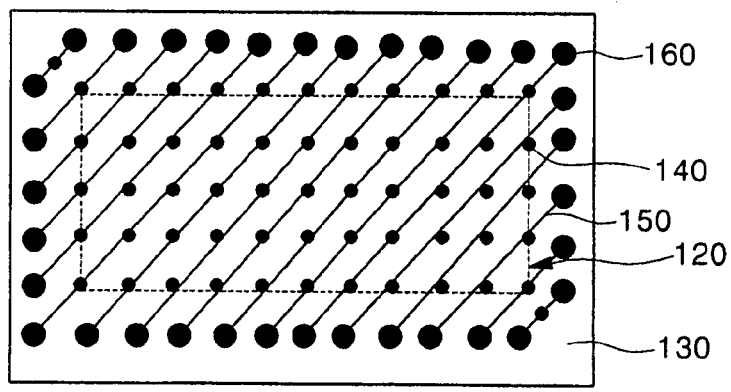

FIG. 11 and FIG. 12 are plan drawings projected on a plane from the top of the catalytic enhanced CVD apparatus shown in FIG. 1. FIG. 11 and FIG. 12 illustrate positions of shower head 130, nozzles 140, filament 150, and substrate 120 disposed in a catalytic enhanced CVD apparatus of FIG. 1 constructed as a tenth and a eleventh preferred embodiments of the present invention. FIGS. 11 and 12 shows filament arrangements having point symmetry.

TENTH PREFERRED EMBODIMENT

Referring to FIG. 11, the tenth preferred embodiment of the present invention defines an arrangement structure of parallel filaments in which the filaments are disposed in a zigzag shape. The filament arrangement structure built according to the tenth preferred embodiment includes multiple electrodes 160 formed in a row on both upper and lower parts of shower head 130 such that the electrodes are spaced from one another in a certain distance, multiple gas nozzles 140 formed on an inner part surrounded by the electrodes, ceramic bolts 180 horizontally periodically disposed in a row between the electrodes, and filaments 150 which connect electrodes 160 and are disposed in a zigzag shape on a lower part of gas nozzles 140 by ceramic bolts 180.

The filament arrangement structure according to the tenth preferred embodiment of the preset invention is a filament arrangement structure capable of maximizing the efficiency of deposition source gases as a parallel filament arrangement structure in which filaments are diagonally connected in a zigzag shape, and which is capable of being converted into a series filament arrangement structure. The filament arrangement structure includes ceramic bolts 180 for arranging the filaments diagonally. The direction of the filaments is turned by winding filaments 150 around ceramic bolts 180.

ELEVENTH PREFERRED EMBODIMENT

Referring to FIG. 12, the eleventh preferred embodiment of the present invention defines a filament arrangement structure in which parallel filaments are diagonally disposed such that the filaments are parallel to each other. The filament arrangement structure according to the eleventh preferred embodiment includes multiple electrodes 160 which are regularly disposed along edges of shower head 130 and are formed such that the electrodes are spaced from one another in a certain distance, multiple gas nozzles 140 formed on an inner area surrounded by the electrodes, and multiple filaments 150 formed under the gas nozzles 140 to diagonally connect electrodes 160. The filament arrangement structure built according to the eleventh preferred embodiment of the present invention is a filament arrangement structure where filaments 150 are diagonally arranged to improve thin film uniformity and heat uniformity.

Filaments 150 arranged according to the tenth preferred embodiment and eleventh preferred embodiments are arranged in such a structure that the filaments are symmetrical about a diagonal axis passing through the center of shower head 130. Filaments 150 are made of tungsten (W), tantalum (Ta), nickel (Ni), or chromium (Cr), and are preferably made of tungsten (W). Filaments 150 are formed to a thickness of 0.3 mm or more, as suggested in the first preferred embodiment, and filaments 150 are preferably formed to a thickness between 0.3 mm and 2.0 mm.

The filaments decompose deposition source gases having silane ($SiH_4$)/ammonia ($NH_3$)/nitrogen ($N_2$) in a filament region in case of forming a hydrogenated silicon nitride (SiN: H) thin film, and decompose deposition source gases containing silane ($SiH_4$)/ammonia ($NH_3$)/nitrous oxide ($N_2O$) in case of forming a silicon oxynitride (SiON) thin film.

Figure 13:
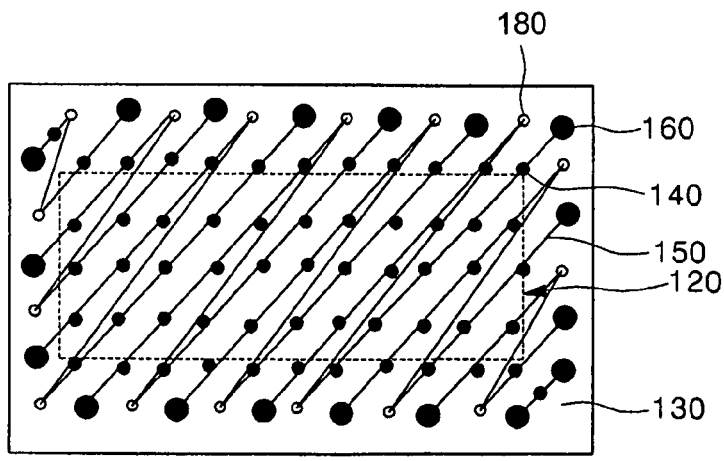
FIG. 13 and FIG. 14 are plan drawings illustrating positions of a shower head, nozzles, filaments and a substrate on a plane in a catalytic enhanced CVD apparatus built as a twelfth and a thirteenth preferred embodiments of the present invention.
Figure 14:
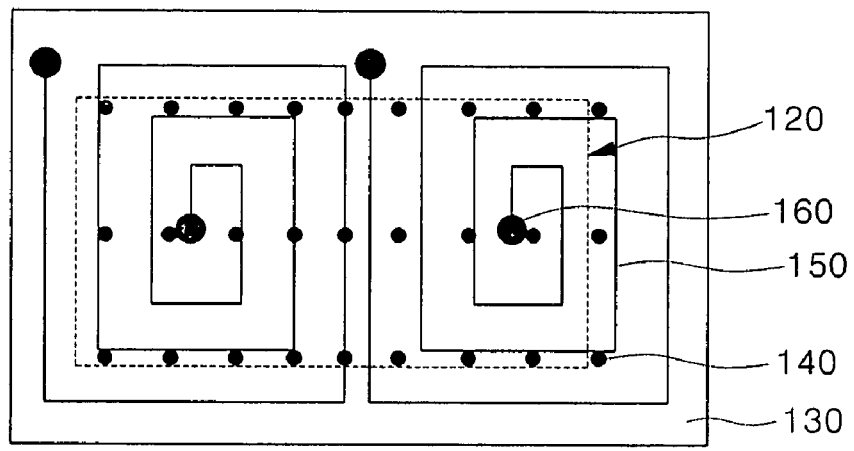

FIG. 13 and FIG. 14 are plan drawings projected on a plane from the top of the catalytic enhanced CVD apparatus shown in FIG. 1. FIG. 13 and FIG. 14 illustrate positions of shower head 130, nozzles 140, filament 150, and substrate 120 disposed in a catalytic enhanced CVD apparatus of FIG. 1 constructed as a tenth and a eleventh preferred embodiments of the present invention. FIGS. 13 and 14 shows filament arrangements that is asymmetric.

TWELFTH PREFERRED EMBODIMENT

Referring to FIG. 13, the twelfth preferred embodiment of the present invention defines a filament arrangement structure in which zigzag shaped filaments of the tenth preferred embodiment are disposed in a diagonal direction. The filament arrangement structure built according to the twelfth preferred embodiment includes multiple electrodes 160 which encircle gas nozzle 140 and are formed such that the electrodes are spaced from one another in a certain distance, multiple gas nozzles 140 formed on an inner part surrounded by the electrodes, ceramic bolts 180, each of which is formed between the electrodes, and multiple filaments 150 which connect electrodes and are arranged through ceramic bolts 180 in a zigzag shape. The filament arrangement structure built according to the twelfth preferred embodiment of the present invention is a filament arrangement structure capable of maximizing the efficiency of deposition source gases by arranging filaments 150 in a diagonal zigzag shape. The diagonal zigzag shaped filaments include ceramic bolts 180 for arranging filaments 150 in a diagonal line. The direction of the filaments is converted by winding filaments 150 around ceramic bolts 180.

THIRTEENTH PREFERRED EMBODIMENT

Referring to FIG. 14, the thirteenth preferred embodiment of the present invention defines a filament arrangement structure in which a rectangular filament pattern is repeated such that a distance between the filaments is sequentially increased in a whirl pattern. The filament arrangement structure built according to the thirteenth preferred embodiment comprises electrodes 160 which are formed on a shower head 130 positioned above a substrate 120 such that pairs of electrodes are diagonally parallel to each other, multiple gas nozzles 140 formed on the circumference of the electrodes such that the gas nozzles are spaced from one another in a certain distance, and multiple filaments 150 which connect electrodes 160, and in which a rectangular filament pattern is repeated such that a distance between the filaments 150 is sequentially increased around an inner electrode along gas nozzles 140. The filament arrangement structure built according to the thirteenth preferred embodiment of the present invention is a filament arrangement structure in which a filament pattern is repeated such that the filament pattern is formed by drawing a square that is gradually increased from the inner side to the outer side of the shower head using the filaments 150 so as to improve uniformity of a thin film, wherein the filaments are connected without cutting in one of the filament patterns. An arrangement structure of filaments 150 built according to the twelfth and thirteenth preferred embodiments is a filament arrangement structure in which the filaments are asymmetrical around a central part of shower head 130.

The filaments 150 are formed of tungsten (W), tantalum (Ta), nickel (Ni), or chromium (Cr), and are preferably made of tungsten (W). Filaments 150 are formed to a thickness of 0.3 mm or more, as described in the first preferred embodiment, and the filaments 150 are preferably formed to a thickness of 0.3 mm to 2.0 mm. The filaments decompose deposition source gases having silane ($SiH_4$)/ammonia ($NH_3$)/nitrogen ($N_2$) in a filament region in case of forming a hydrogenated silicon nitride (SiN:H) thin film, and decompose deposition source gases containing silane ($SiH_4$)/ammonia ($NH_3$)/nitrous oxide ($N_2O$) in case of forming a silicon oxynitride (SiON) thin film.

As described above, efficiency of gas use is improved to a level higher than 80%, and a uniform thin film can be obtained by efficiently arranging filaments of a catalytic enhanced CVD apparatus, thereby uniformly decomposing deposition source gases all over a thin film formation region of the substrate. Therefore, characteristics of the thin film are improved by forming a thin film having high quality.

Figure 15:
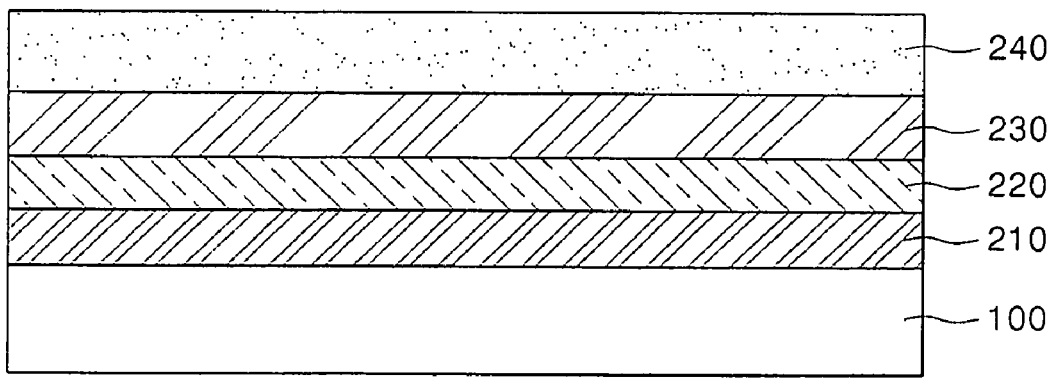
FIG. 15 is a cross-sectional view of an organic electroluminescent device using an inorganic film formed by a catalytic enhanced CVD having a filament arrangement disposed inside a catalytic enhanced CVD apparatus constructed according to one preferred embodiment of the present invention.

FIG. 15 is a cross-sectional view of an organic electroluminescent device using an inorganic film formed through an arrangement structures of filaments mounted on a shower head of a catalytic enhanced CVD apparatus constructed according to one of the preferred embodiments of the present invention. Referring to FIG. 15, an organic electroluminescent device having an inorganic film is provided on substrate 100 that is made of glass, plastic or quartz. The inorganic film is formed by a catalytic enhanced CVD apparatus of the present invention, where an arrangement structure of filaments is mounted on a shower head of a catalytic enhanced CVD apparatus.

First electrode 210 is formed on substrate 100. First electrode 210 is an anode electrode such as a transparent electrode formed of Indium Tin Oxide (ITO) or Indium Zinc Oxide (IZO) having high work function or a transparent electrode formed of ITO or IZO including a reflection film formed of a metal having characteristics of high reflectivity such as aluminum or aluminum alloy as a lower layer. When first electrode 210 is a transparent electrode including a reflection film as a lower layer, first electrode 210 is formed as a reflection type anode electrode. First electrode 210 is formed by sputtering, vacuum deposition or ion plating, and the first electrode is ordinarily formed through patterning process using a mask after performing deposition by sputtering.

Subsequently, organic layer 220 including at least organic emitting layer is formed on an upper part of first electrode 210. The organic emitting layer is formed of low molecular materials such as aluminum quinolate (Alq3), anthracene and cyclopentadiene or high molecular materials such as PPV (poly-(p-phenylenevinylene)), PT(polythiophene), PPP(poly (p-phenylene)) and derivatives thereof. Organic layer 220 further includes one or more layers selected from hole injection layer, hole transport layer, electron transport layer and electron injection layer in addition to the organic emitting layer. Organic layer 220 is deposited by methods such as vacuum deposition, spin coating, inkjet printing, laser induced thermal imaging (LITI), etc. Organic layer 220 is preferably deposited by spin coating or vacuum deposition method. Furthermore, The organic layer may be patterned by LITI or vacuum deposition method using a shadow mask.

Second electrode 230 is formed on an upper part of organic layer 220. Second electrode 230 is a reflection electrode or a transmission electrode formed of one conductive metal having low work function selected from the group consisting of magnesium (Mg), calcium (Ca), aluminum (Al), silver (Ag) and an alloy thereof. Inorganic film 240 is formed on an upper part of second electrode 230.

Inorganic film 240 is formed by filaments which are mounted on shower head of a catalytic enhanced CVD apparatus and have any one structure selected from a horizontal symmetrical filament arrangement structure, a diagonal symmetrical filament arrangement structure and an asymmetrical filament arrangement structure that are the foregoing filament arrangement structures of first to thirteenth preferred embodiments of the present invention.

Filaments 150 are made of tungsten (W), tantalum (Ta), nickel (Ni) or chromium (Cr), and are preferably made of tungsten (W). Filaments 150 are formed to a thickness of 0.3 mm or more, as suggested in the first preferred embodiment, and filaments 150 are preferably formed to a thickness between 0.3 mm and 2.0 mm. Decomposition of the deposition source gases is deteriorated when thickness of filaments 150 is 0.3 mm or less, and a high temperature is required during the process when thickness of filaments 150 is 2 mm or more. The filaments decompose deposition source gases having silane ($SiH_4$)/ammonia ($NH_3$)/nitrogen ($N_2$) in a filament region in case of forming a hydrogenated silicon nitride (SiN:H) thin film, and decompose deposition source gases containing silane ($SiH_4$)/ammonia ($NH_3$)/nitrous oxide ($N_2O$) in case of forming a silicon oxynitride (SiON) thin film.

Inorganic film 240 is silicon nitride (SiNx) or silicon oxynitride (SiON). Inorganic film 240 functions as a protection film for protecting an organic emitting layer formed on organic layer 220 from external moisture or oxygen, and is capable of being applied to encapsulation of an organic electroluminescent device instead of encapsulation using a conventional metal can or glass.

Because inorganic film 240 formed using an arrangement structure of tungsten (W) filaments mounted on shower head 130 of a catalytic enhanced CVD apparatus constructed according to the present invention is capable of obtaining a uniform thin film such that the inorganic film is excellent in preventing moisture penetration, the inorganic film maintains excellent thin film characteristics as a protection film in an organic electroluminescent device. Accordingly, the lifetime of the organic electroluminescent device is improved by preventing degradation of an organic emitting layer.

As described above, the present invention is capable of maximizing efficiency of gas use to 80% or more, and obtaining a uniform thin film by efficiently arranging tungsten (W) filaments of a catalytic enhanced CVD apparatus, thereby uniformly decomposing deposition source gases. Furthermore, the present is capable of improving a lifetime of an organic electroluminescent device by using an inorganic film formed through tungsten (W) filament arrangement structure of the catalytic enhanced CVD apparatus in an organic electroluminescent device, thereby preventing penetration of moisture or oxygen such that an organic emitting layer is prevented from being degraded.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A catalytic enhanced chemical vapor deposition apparatus comprising:
   a deposition chamber;
   a shower head for storing a deposition source gas, the showerhead including at least two electrodes;
   a plurality of gas nozzles formed on the shower head and coupled to the deposition chamber for spraying the deposition source gas into inside of the deposition chamber; and
   a filament formed on the shower head and disposed between the plurality of gas nozzles and a substrate on which a deposition is made, the filament being coupled to the electrodes, the filament formed into a pattern, the filament including a plurality of sub-filaments, each of the sub-filaments forming a straight line, the sub-filaments parallel to each other and formed such that a distance between the nearest sub-filaments formed around an edge part of the pattern is narrower than the distance between the nearest sub-filaments formed an central part of the pattern.

2. The catalytic enhanced chemical vapor deposition apparatus according to claim 1, comprised of the filament made of a material selected from the group consisting of tungsten, tantalum, nickel, and chromium.

3. The catalytic enhanced chemical vapor deposition apparatus according to claim 1, comprised of the filament having thickness greater than about 0.3 millimeters.

4. The catalytic enhanced chemical vapor deposition apparatus according to claim 3, comprised of the filament having thickness between about 0.3 millimeters and about 2.0 millimeters.

5. The catalytic enhanced chemical vapor deposition apparatus according to claim 1, comprised of the deposition source gas being a mixture including silane, ammonia, and nitrogen.

6. The catalytic enhanced chemical vapor deposition apparatus according to claim 1, comprised of the deposition source gas being a mixture including silane, ammonia, and nitrous oxide.

7. A catalytic enhanced chemical vapor deposition apparatus comprising:
    a deposition chamber;
    a shower head for storing a deposition source gas, the showerhead including at least two electrodes;
    a plurality of gas nozzles formed on the shower head and coupled to the deposition chamber for spraying the deposition source gas into inside of the deposition chamber; and
    a filament formed on the shower head and disposed between the plurality of gas nozzles and a substrate on which a deposition is made, the filament being coupled to the electrodes, the filament formed into a pattern, the pattern being asymmetric.

8. The catalytic enhanced chemical vapor deposition apparatus according to claim 7, comprised of the pattern including a plurality of sub-patterns, each of the sub-patterns being the same.

9. The catalytic enhanced chemical vapor deposition apparatus according to claim 7, comprised of the filament made of a material selected from the group consisting of tungsten, tantalum, nickel, and chromium.

10. The catalytic enhanced chemical vapor deposition apparatus according to claim 7, comprised of the filament having thickness greater than about 0.3 millimeters.

11. The catalytic enhanced chemical vapor deposition apparatus according to claim 10, comprised of the filament having thickness between about 0.3 millimeters and about 2.0 millimeters.

12. The catalytic enhanced chemical vapor deposition apparatus according to claim 7, comprised of the deposition source gas being a mixture including silane, ammonia, and nitrogen.

13. The catalytic enhanced chemical vapor deposition apparatus according to claim 7, comprised of the deposition source gas being a mixture including silane, ammonia, and nitrous oxide.

14. A catalytic enhanced chemical vapor deposition apparatus comprising:
    a deposition chamber;
    a shower head for storing a deposition source gas, the showerhead including at least two electrodes;
    a plurality of gas nozzles formed on the shower head and coupled to the deposition chamber for spraying the deposition source gas into inside of the deposition chamber; and
    a filament formed on the shower head and disposed between the plurality of gas nozzles and a substrate on which a deposition is made, the filament being coupled to the electrodes, the filament formed into a pattern having a loop shape surrounding the gas nozzles.

15. The catalytic enhanced chemical vapor deposition apparatus according to claim 14, comprised of the filament made of a material selected from the group consisting of tungsten, tantalum, nickel, and chromium.

16. The catalytic enhanced chemical vapor deposition apparatus according to claim 14, comprised of the filament having thickness greater than about 0.3 millimeters.

17. The catalytic enhanced chemical vapor deposition apparatus according to claim 16, comprised of the filament having thickness between about 0.3 millimeters and about 2.0 millimeters.

18. The catalytic enhanced chemical vapor deposition apparatus according to claim 14, comprised of the deposition source gas being a mixture including silane, ammonia, and nitrogen.

19. The catalytic enhanced chemical vapor deposition apparatus according to claim 14, comprised of the deposition source gas being a mixture including silane, ammonia, and nitrous oxide.

* * * * *